US010317455B2

(12) United States Patent
Schmelzer

(10) Patent No.: US 10,317,455 B2
(45) Date of Patent: Jun. 11, 2019

(54) APPARATUS AND METHOD FOR MONITORING AN ELECTRICAL INSULATION FOR AN ONBOARD POWER SUPPLY SYSTEM OF A VEHICLE

(71) Applicant: Continental Automotive GmbH, Hannover (DE)

(72) Inventor: Lars Schmelzer, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 323 days.

(21) Appl. No.: 15/127,003

(22) PCT Filed: Mar. 16, 2015

(86) PCT No.: PCT/EP2015/055437
§ 371 (c)(1),
(2) Date: Sep. 16, 2016

(87) PCT Pub. No.: WO2015/140107
PCT Pub. Date: Sep. 24, 2015

(65) Prior Publication Data
US 2017/0108544 A1    Apr. 20, 2017

(30) Foreign Application Priority Data

Mar. 17, 2014    (DE) .................. 10 2014 204 870

(51) Int. Cl.
*G01R 27/02*    (2006.01)
*G01R 31/00*    (2006.01)
(Continued)

(52) U.S. Cl.
CPC ........ *G01R 31/1227* (2013.01); *B60L 3/0069* (2013.01); *G01R 27/025* (2013.01); *G01R 31/005* (2013.01); *G01R 31/025* (2013.01)

(58) Field of Classification Search
CPC ................. G01R 31/1227; G01R 31/005; G01R 31/025; G01R 31/12; G01R 31/006; G01R 31/1272; G01R 27/025; B60L 3/0069
(Continued)

(56) References Cited

U.S. PATENT DOCUMENTS

| 5,818,236 A * | 10/1998 | Sone ................ B60L 3/0023 |
| | | 324/509 |
| 6,700,384 B2 * | 3/2004 | Yugou ............. G01R 19/16542 |
| | | 324/434 |

(Continued)

FOREIGN PATENT DOCUMENTS

| WO | 2012160118 A1 | 11/2012 |
| WO | 2013147494 A1 | 10/2013 |

OTHER PUBLICATIONS

International Search Report and Written Opinion dated Jun. 18, 2015 from corresponding International Patent Application No. PCT/EP2015/055437.

*Primary Examiner* — Patrick Assouad
*Assistant Examiner* — Sean Curtis

(57) ABSTRACT

A device for monitoring an electrical insulation in a vehicle electrical system comprises a voltage source that generates DC voltages and a determining unit, configured to determine an insulation resistance between the vehicle electrical system and ground and from current measurement values of at least two current measuring units and from the first and second voltage values.

10 Claims, 2 Drawing Sheets

(51) Int. Cl.
  *G01R 31/02* (2006.01)
  *G01R 31/12* (2006.01)
  *B60L 3/00* (2019.01)
(58) Field of Classification Search
  USPC ........................................................ 324/551
  See application file for complete search history.

(56) References Cited

U.S. PATENT DOCUMENTS

| | | | | |
|---|---|---|---|---|
| 6,952,103 | B2* | 10/2005 | Herb | G01R 27/18 324/500 |
| 8,310,242 | B2* | 11/2012 | Itten | G01R 27/18 324/509 |
| 8,674,704 | B2* | 3/2014 | Kawamura | G01R 27/18 324/541 |
| 9,030,207 | B2* | 5/2015 | Lasson | G01R 27/18 324/500 |
| 9,114,710 | B2* | 8/2015 | Makino | B60L 3/0069 |
| 9,169,764 | B2* | 10/2015 | Hashimoto | B60L 3/0069 |
| 9,199,539 | B2* | 12/2015 | Iwanabe | G01R 31/02 |
| 9,236,827 | B2* | 1/2016 | Enomoto | B60L 3/0069 |
| 9,244,108 | B2* | 1/2016 | Hausberger | B60L 3/0069 |
| 9,255,957 | B2* | 2/2016 | Arima | H02H 3/16 |
| 9,322,867 | B2* | 4/2016 | Chatroux | G01R 27/18 |
| 9,470,737 | B2* | 10/2016 | Lasson | G01R 27/18 |
| 9,829,529 | B2* | 11/2017 | Tsukamoto | G01R 31/025 |
| 2008/0084215 | A1* | 4/2008 | Itten | G01R 27/18 324/510 |
| 2008/0197855 | A1* | 8/2008 | Uchida | G01R 27/025 324/509 |
| 2009/0323233 | A1* | 12/2009 | Shoemaker | B60L 3/0069 361/42 |
| 2011/0006777 | A1* | 1/2011 | Park | B60L 3/0046 324/509 |
| 2011/0148428 | A1* | 6/2011 | Lasson | G01R 27/18 324/503 |
| 2013/0300430 | A1* | 11/2013 | Lindsay | B60L 3/0046 324/522 |
| 2013/0314097 | A1* | 11/2013 | Hausberger | B60L 3/0069 324/503 |
| 2014/0103936 | A1* | 4/2014 | Lasson | G01R 27/18 324/503 |
| 2014/0103939 | A1* | 4/2014 | Chatroux | G01R 27/18 324/551 |
| 2014/0109556 | A1* | 4/2014 | Hashimoto | B60L 3/0069 60/299 |
| 2014/0197844 | A1* | 7/2014 | Chang | G01R 31/025 324/509 |
| 2014/0214262 | A1* | 7/2014 | Iwanabe | G01R 31/025 701/31.7 |
| 2015/0192630 | A1* | 7/2015 | Tsukamoto | G01R 31/025 324/426 |
| 2017/0106754 | A1* | 4/2017 | Schmelzer | B60L 3/0069 |
| 2017/0108544 | A1* | 4/2017 | Schmelzer | G01R 27/025 |

* cited by examiner

APPARATUS AND METHOD FOR MONITORING AN ELECTRICAL INSULATION FOR AN ONBOARD POWER SUPPLY SYSTEM OF A VEHICLE

TECHNICAL FIELD

The invention relates to an apparatus and a method for monitoring an electrical insulation for an onboard power supply system of a vehicle, particularly a hybrid/electric vehicle. Further, the invention relates to an onboard power supply system for a vehicle and to a vehicle, particularly a hybrid/electric vehicle, having an onboard power supply system, wherein the onboard power supply system comprises an apparatus as cited above.

BACKGROUND

Modern vehicles and in particular hybrid or electric vehicles, have onboard power supply systems that comprise a high voltage onboard power supply system path in which an operating voltage of several hundred volts prevails.

A voltage of over 60 volts is life threatening for human beings, particularly for children, however. Therefore, a high voltage onboard power supply system path having an operating voltage of more than 60 volts is electrically insulated from the remainder of the onboard power supply system or from the vehicle bodywork in order to eliminate a threat to human beings.

If there are technical failures in the onboard power supply system or in the event of operating errors, what is known as a fault current can flow through the human body from the high voltage onboard power supply system path. If the electrical insulation between said high voltage onboard power supply system path and the remainder of the onboard power supply system or the vehicle bodywork is intact and sufficiently high at that time, then the amperage of the fault current is limited to a value that is not hazardous to human beings.

If the electrical insulation is not sufficiently high, however, then a fault current having an amperage of several milliamps can flow through human bodies, which can be life threatening to human beings.

In order to avoid such life-threatening fault currents from the outset, it is necessary to monitor the electrical insulation in the onboard power supply system continually and to identify potential hazards as early as possible.

SUMMARY

It is therefore the object of the present invention to provide an inexpensive way of monitoring an electrical insulation for an onboard power supply system of a vehicle. This object is achieved by subjects of the independent claims. Advantageous refinements are covered by the subclaims.

According to a first aspect of the invention, an apparatus for monitoring an electrical insulation for an onboard power supply system of a vehicle, particularly a hybrid/electric vehicle, is provided. Accordingly, the apparatus comprises a power source that is set up to generate or to produce a first DC voltage having a first voltage value and a second DC voltage having a second voltage value.

The apparatus has an electrical connection point via which a positive power supply line of the onboard power supply system, particularly of a high voltage onboard power supply system path of the onboard power supply system, and a negative power supply line of the onboard power supply system or of the high voltage onboard power supply system path are electrically connected or connectable to one another.

The apparatus further comprises a first current path between the positive power supply line and the electrical connection point, a second current path between the negative power supply line and the electrical connection point and a third current path between the electrical connection point and the power source. The apparatus additionally comprises at least two of the following three current measuring units:
 a first current measuring unit in the first current path for measuring a first current flowing through the first current path,
 a second current measuring unit in the second current path for measuring a second current flowing through the second current path,
 a third current measuring unit in the third current path for measuring a third current flowing through the third current path.

Furthermore, the apparatus comprises an ascertainment unit that is electrically connected to the respective signal output of the at least two of the three current measuring units via signal inputs. The ascertainment unit is set up to ascertain from first measured current values and second measured current values and also the voltage values of the generated voltages an insulation resistance between the onboard power supply system and electrical ground or between the high voltage onboard power supply system path of the onboard power supply system and the remainder of the onboard power supply system.

In this case, the first measured current values are current values of two currents that flow through two of the three current paths during a first period, during which the power source generates the first DC voltage, under the effect of the first DC voltage. The current values of these two currents are measured during said first period by the respective current measuring units arranged in the respective two current paths and are forwarded to the ascertainment unit as first measured current values.

Analogously, the second measured current values are current values of two currents that flow through the respective two current paths during a second period, during which the power source generates the second DC voltage, under the effect of the second DC voltage. The current values of these two currents are measured during said second period by the corresponding current measuring units and are forwarded to the ascertainment unit as second measured current values.

The term "DC voltage" is understood to mean a voltage that has a constant voltage value over a determined period that is required for measuring the aforementioned measured current values. The power source therefore generates DC voltages having different but constant voltage values.

To monitor the electrical insulation for the onboard power supply system, particularly between the high voltage onboard power supply system path and the remainder of the onboard power supply system or the vehicle bodywork, the apparatus uses the power source to generate two DC voltages having different voltage values at a determined interval of time indirectly or directly in succession. Under the effect of the two DC voltages, currents having different current values flow through the three current paths and subsequently from the current paths to the positive and negative power supply lines of the onboard power supply system or high voltage onboard power supply system path of the onboard power supply system.

If the electrical insulation for the onboard power supply system, particularly between the high voltage onboard power supply system path and the remainder of the onboard power supply system or the vehicle bodywork, is sufficiently high, then no current or barely any current flows under the effect of the two DC voltages from the high voltage onboard power supply system path or from the two power supply lines to the remainder of the onboard power supply system or to the vehicle bodywork (electrical ground).

If the onboard power supply system or the high voltage onboard power supply system path is not sufficiently insulated from the vehicle bodywork as a result of failures in the onboard power supply system, for example, then a leakage current path forms between the high voltage onboard power supply system path and the remainder of the onboard power supply system or between the power supply lines of the high voltage onboard power supply system path and the remainder of the onboard power supply system, and leakage currents flow from the high voltage onboard power supply system path to the remainder of the onboard power supply system or the vehicle bodywork through said leakage current path under the effect of the two DC voltages.

The two current measuring units can then be used by the apparatus to measure current values of the currents flowing through the current paths and to take the measured current values and the known voltage values of the two DC voltages as a basis for ascertaining the insulation resistance between the high voltage onboard power supply system path and the remainder of the onboard power supply system or the vehicle bodywork.

The ascertained insulation resistance can then be compared with a prescribed reference resistance. If the ascertained insulation resistance is below the reference resistance, then there is assumed to be an electrical leak between the onboard power supply system and the electrical ground or between the high voltage onboard power supply system path and the remainder of the onboard power supply system or the electrical ground. Accordingly, warnings are output to the driver of the vehicle or suitable previously stipulated measures, in particular suitable automatic measures, are initiated. By way of example, the possible automatic measures include electrically isolating or discharging the electrical energy stores, such as e.g. traction battery, having charging voltages of over 60 volts from the onboard power supply system.

In this case, the current measuring units, are implementable inexpensively in a simple manner, for example using shunt resistors or Hall sensors having downstream operational amplifiers. The power source used can be, for example, a simple DC-DC voltage converter that is electrically connected to a low voltage onboard power supply system path of the onboard power supply system and generates the two DC voltages by up-converting (and if need be by inverting) the operating voltage of the low voltage onboard power supply system path. The ascertainment unit can be implemented with a simple inexpensive microprocessor and an inexpensive analog-to-digital converter. This provides an apparatus that can use simple inexpensive electrical/electronic components to reliably ascertain electrical insulation for an onboard power supply system of a vehicle, particularly between a high voltage onboard power supply system path and the remainder of the onboard power supply system or the vehicle bodywork, in a simple manner. Consequently, an inexpensive way of reliably monitoring an electrical insulation for an onboard power supply system of a vehicle is provided.

According to a preferred refinement of the apparatus, said apparatus comprises all three of the aforementioned current measuring units, wherein the ascertainment unit is electrically connected to the respective signal output of the three current measuring units via three signal inputs. In this case, the third current measuring unit or the measured current values therefrom is/are used to check the ascertained insulation resistance and therefore allow(s) even more reliable monitoring of the electrical insulation for the onboard power supply system.

According to a further preferred refinement of the apparatus, said apparatus comprises, in the first current path, a first resistor for limiting the first and/or the third current. Preferably, the apparatus comprises, in the second current path, a second resistor for limiting the second and/or the third current. In this case, the two resistors are embodied with high resistance. Preferably, the two resistors have resistance values that are in the megaohm range.

According to yet a further preferred refinement of the apparatus, said apparatus comprises, in the first current path, a first controllable switch for breaking or making electrical connection in the first current path. As an alternative or in addition to the first switch in the first current path, the apparatus comprises, in the second current path, a second controllable switch for breaking or making electrical connection in the second current path. Controlled opening of these two controllable switches allows the apparatus to be electrically isolated from the onboard power supply system in the time in which no monitoring of the electrical insulation for the onboard power supply system takes place. Only when required, namely when monitoring the electrical insulation, is it possible for the apparatus to be electrically connected to the onboard power supply system as a result of controlled closure of the two switches.

According to yet a further preferred refinement of the apparatus, said apparatus ascertains the insulation resistance R_ISO on the basis of the following simple equation:

$$R\_ISO = \frac{(Uq1 - Ia1 \cdot Ra) + (Uq1 - Ib1 \cdot Rb) - (Uq2 - Ia2 \cdot Ra) - (Uq2 - Ib2 \cdot Ra)}{n \cdot ((Ia1 - Ia2) + (Ib1 - Ib2))}$$

where:

Uq1 is the first voltage value of the first DC voltage;

Uq2 is the second voltage value of the second DC voltage;

Ia1, Ib1 are the respective first measured current values of the currents that flow in each case through the first and second current paths under the effect of the first DC voltage;

Ia2, Ib2 are the respective second measured current values of the currents that flow in each case through the first and second current paths under the effect of the second DC voltage;

n is a numerical coefficient that is preferably 2;

Ra and Rb are the respective resistances in the first and second current paths through which the respective currents flow under the effect of the first and second DC voltages.

The measured current values Ia1, Ia2, Ib1, Ib2 are either measured directly by the first and second current measuring units or computed from the measured current values from the first and third current measuring units or from the measured current values from the second and third current measuring units on the basis of the following equations:

$$Ic1 = Ia1 + Ib1$$

$$Ic2 = Ia2 + Ib2$$

where

Ic1 is a first measured current value of a current flowing through the third current path under the effect of the first DC voltage;

Ic2 is a second measured current value of a current flowing through the third current path under the effect of the second DC voltage.

The insulation resistance is therefore computed as the quotient of the difference between the first and second applied DC voltages corrected by the respective voltages dropped across the resistors and the difference between the two current values that flow through the first and second current paths in each case under the effect of the first and second DC voltages.

According to yet a further preferred refinement of the apparatus, the first voltage value of the first DC voltage is 50 to 60 volts. Preferably, the second voltage value of the second DC voltage is −60 to −50 volts.

In this case, the upper limit values 60 and −60 volts are the upper limit of the generable DC voltages that are not yet life threatening to human beings or vehicle occupants. The lower limit values 50 and −50 volts allow a voltage swing of at least 100 volts between the two DC voltages, this entailing correspondingly large value differences for the measured current values of the first, second and third currents. The large value differences for the measured current values in turn allow accurate ascertainment of the insulation resistance. Additionally, the high voltage values are robust toward voltage fluctuations in the current paths or in the onboard power supply system.

According to a further aspect of the invention, an onboard power supply system for a vehicle, particularly a hybrid/electric vehicle, is provided, wherein the onboard power supply system has an apparatus, described above, for monitoring the electrical insulation for the onboard power supply system or between a high voltage onboard power supply system path of the onboard power supply system and the remainder of the onboard power supply system or the vehicle bodywork.

According to yet a further aspect of the invention, a vehicle, particularly a hybrid/electric vehicle, having an onboard power supply system is provided, wherein the onboard power supply system has an apparatus, described above, for monitoring the electrical insulation for the onboard power supply system or between a high voltage onboard power supply system path of the onboard power supply system and the remainder of the onboard power supply system or the vehicle bodywork.

According to yet a further aspect of the invention, a method for monitoring an electrical insulation for an onboard power supply system of a vehicle, particularly a hybrid/electric vehicle, is provided. In this case, the method has the following method steps:

wiring or connection of a power source electrically between electrical ground and an electrical connection point via which a positive power supply line of the onboard power supply system and a negative power supply line of the onboard power supply system are electrically connected or connectable to one another;

first generation of a first DC voltage having a first voltage value by means of the power source;

first measurement of a respective first measured current value of a first and a second current, wherein the first and the second current each flow through one of the following three current paths under the effect of the first DC voltage:

a first current path between the positive power supply line and the electrical connection point, a second current path between the negative power supply line and the electrical connection point, a third current path between the electrical connection point and the power source;

second generation of a second DC voltage having a second voltage value by means of the power source;

second measurement of a respective second measured current value of the first and the second current flowing through the respective current path in each case under the effect of the second DC voltage;

ascertainment of an insulation resistance between the onboard power supply system and electrical ground from the first and the second voltage value and also the first and the second measured current values.

Accordingly, a power source is wired or electrically connected between electrical ground and an electrical connection point of the onboard power supply system, via which electrical connection point a positive power supply line of the onboard power supply system and a negative power supply line of the onboard power supply system are electrically connected or connectable to one another. The electrical ground used in this case is the vehicle bodywork or an electrical ground connection of the onboard power supply system, for example.

To monitor the electrical insulation for the onboard power supply system, the DC power source is used to generate a first DC voltage having a first voltage value for a determined first period. The first DC voltage produces a respective flow of current from the third current path to the first current path and from the third current path to the second current path. These flows of current overlap a flow of current that flows from the positive power supply line via the first and second current paths to the negative power supply line. These overlapping flows of current result in alterations in the currents that flow through the first and second current paths. These current alterations are measured and negated as first measured current values for ascertaining the insulation resistance.

In order to a prescribed time interval indirectly or directly after measurement of the first measured current values, the DC power source is used to generate a second DC voltage having a second voltage value for a determined second period. Accordingly, currents or alterations in the currents that flow through the respective current paths under the effect of the second DC voltage are measured in this second period, in which the second DC voltage is generated. The second measured current values are then used with the previously measured first measured current values to ascertain the insulation resistance.

From these first and second measured current values and the two voltage values, an insulation resistance between the onboard power supply system and the electrical ground or between a high voltage onboard power supply system path of the onboard power supply system and the remainder of the onboard power supply system or the electrical ground is then ascertained.

The ascertained insulation resistance value is subsequently compared with a prescribed reference resistance value. If the ascertained insulation resistance value is below the reference resistance value, it is assumed that there is an electrical leak between the onboard power supply system and the electrical ground or between the high voltage onboard power supply system path and the remainder of the onboard power supply system or the electrical ground.

According to one preferred refinement of the method, the insulation resistance is computed as the quotient of the difference between the first voltage value of the first DC voltage and the second voltage value of the second DC voltage corrected by the respective voltage values dropped across respective resistors of the respective current paths and the difference between the first and the second current values of the currents that flow through the first and second current paths in each case under the effect of the first and second DC voltages.

According to one preferred refinement of the method, the insulation resistance is ascertained on the basis of the aforementioned equation:

$$R\_ISO = \frac{(Uq1 - Ia1 \cdot Ra) + (Uq1 - Ib1 \cdot Rb) - (Uq2 - Ia2 \cdot Ra) - (Uq2 - Ib2 \cdot Ra)}{n \cdot ((Ia1 - Ia2) + (Ib1 - Ib2))}$$

According to a further preferred refinement of the method, measurement of the first measured current values prompts a first operating voltage value of the operating voltage of the onboard power supply system to be measured and measurement of the second measured current values prompts a second operating Voltage value of the operating voltage to be measured. The first and second operating voltage values are subsequently compared with one another.

If the first and second operating voltage values differ from one another by more than a prescribed limit value, then the first measured current values are rejected and the power source is used to generate a third DC voltage having a third voltage value. Further, a third measured current value of the first and second currents flowing through the respective current path in each case under the effect of the third DC voltage and a third operating voltage value of the operating voltage are respectively measured. The second and third operating voltage values are subsequently compared with one another. If the second and third operating voltage values do not differ from one another or differ by less than the limit value, then the insulation resistance is ascertained from the second and third voltage values and also the second and third measured current values.

In this case, the "generation" and "measurement" method steps are repeated until the operating voltage remains constant between two successive measurement steps.

According to an alternative refinement of the method, the first measured current values are not discarded in the event of a discrepancy between the first and second operating voltage values by more than the limit value. By contrast, the insulation resistance continues to be ascertained from the first and second voltage values and also the first and second measured current values and corrected by a correction factor. In this case, the correction factor is ascertained on the basis of the discrepancy between the first and second operating voltage values. Preferably, the correction factor is read from a correction factor table (what is known as a lookup table) on the basis of the discrepancy, said correction factor table storing different correction factors for different discrepancies in the operating voltage values in a manner ascertained in advance and in readable form.

According to a further preferred refinement of the method, not only the first measured current values of the first and second currents but also, simultaneously, a first measured current value of a third current are measured, wherein the first, second and third currents each flow through one of the three current paths under the effect of the first DC voltage. Moreover, not only the second measured current values of the first and second currents but also, simultaneously, a second measured current value of the third current are measured, wherein the first, second and third currents each flow one of the three current paths under the effect of the second DC voltage. The first and second measured current values of the third current are used to check the accuracy of the ascertained insulation resistance.

In this case, the respective first and the respective second measured current values of the three currents can be compared with one another. To this end, a node equation according to "Kirchhoff's" rules is produced for the electrical connection point and a check is performed to determine whether the sum of the respective first and the respective second measured current values is 0 (zero). If the sum differs from zero, the respective first and second measured current values are rejected or corrected by appropriate factors.

Alternatively, the two measured current values of the third current can be used to ascertain the insulation resistance. In this case, the insulation resistance is computed three times independently of one another respectively on the basis of the respective two measured current values of the first and second currents, on the basis of the respective two measured current values of the first and third currents and on the basis of the respective two measured current values of the second and third currents. The insulation resistance is then determined as the mean value of the three computed insulation resistance values.

Alternatively, one or other insulation resistance values that do not appear plausible are rejected and the insulation resistance is then determined from the leftover insulation resistance values that appear plausible.

According to yet a further preferred refinement of the method, the aforementioned method steps of the first generation, first measurement, second generation, second measurement and ascertainment take place during the driving mode of the vehicle. This means that the electrical insulation for the onboard power supply system can also be ascertained in the time in which there is operating voltage present and onboard power supply system currents flow in the onboard power supply system.

If the DC voltages are generated during the driving mode of the vehicle and said currents are measured during the driving mode of the vehicle, then the operating voltage on the high voltage onboard power supply system path is measured as well.

In the equation above, it is assumed that the operating voltage in the onboard power supply system or in the high voltage onboard power supply system path does not change. If the operating voltage remains constant for the entire duration of the method, then the insulation resistance is ascertained on the basis of the above equation. The insulation resistance value obtained in this manner is then compared with a prescribed reference resistance value.

If the operating voltage changes in the time between the first and second measurements, however, then the first measured current values, as proposed previously in a preferred refinement, are rejected and a third DC voltage is generated and further measured current values are measured. The third measured current values measured in this manner and the third voltage value of the third DC voltage are then used to ascertain the insulation resistance instead of the first measured current values and the first voltage value. In this case, the "generation" and "measurement" method steps are repeated until the operating voltage remains constant between two successive measurement steps.

Alternatively, the alteration in the operating voltage during the "generation" and "measurement" method steps can be taken into consideration for ascertaining the insulation resistance. As already mentioned above, the insulation resistance ascertained on the basis of the above equation is corrected by an appropriate correction factor in this case on the basis of the alteration in the operating voltage or the discrepancy in the measured operating voltage values. To this end, appropriate correction factors are ascertained in advance for different initial and altered values of the operating voltage and are stored in the correction factor table. To correct the computed insulation resistance, a correction factor can be read from the table on the basis of the discrepancy between the measured operating voltage values. The computed insulation resistance is then corrected by this correction factor. The corrected insulation resistance value obtained in this manner is then compared as the present insulation resistance value of the high voltage onboard power supply system path with the reference resistance value.

The aforementioned five method steps from "first generation" to "ascertainment" can also take place cyclically, however, in the time in which the vehicle is not in driving mode and the operating voltage in the high voltage onboard power supply system path is 0 volt.

Advantageous refinements of the apparatus illustrated above can also, provided that they are otherwise transferrable to the aforementioned onboard power supply system or vehicle or to the method described above, be regarded as advantageous refinements of the onboard power supply system, of the vehicle or of the method. Analogously, advantageous refinements of the method described above can also, provided that they are otherwise transferrable to the apparatus described above, the onboard power supply system or the vehicle, be regarded as advantageous refinements of the apparatus, of the onboard power supply system or of the vehicle.

BRIEF DESCRIPTION OF THE FIGURES

Exemplary embodiments of the present invention will now be explained in more detail below with reference to the accompanying drawings, in which.

DETAILED DESCRIPTION

Figure 1:
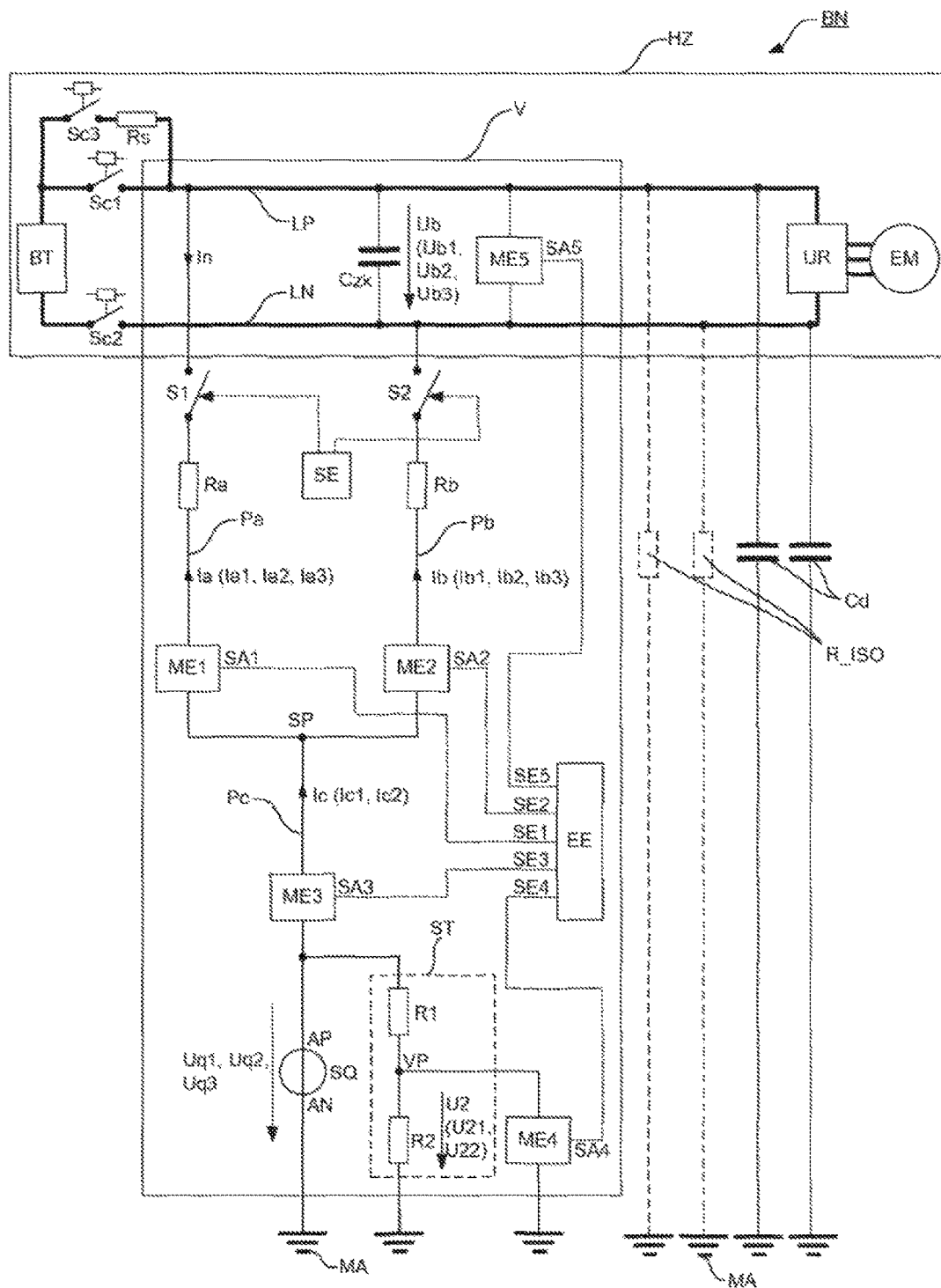
FIG. 1 shows a schematic illustration of an onboard power supply system of an electric vehicle having an apparatus according to an embodiment of the invention.

Reference will first of all be made to FIG. 1, which schematically shows an onboard power supply system BN of an electric vehicle, which is not shown in the figure, having an apparatus V for monitoring an electrical insulation for the onboard power supply system.

The onboard power supply system BN comprises a high voltage onboard power supply system path HZ in which an operating voltage Ub of approximately 500 volts prevails. This high voltage onboard power supply system path HZ is used to provide electric current for an electric machine EM in the high voltage onboard power supply system path HZ, which electric machine is used for driving the electric vehicle.

In this high voltage onboard power supply system path HZ, the onboard power supply system BN has a traction battery BT as an energy or current source that provides the current required for operating the electric machine EM or for driving the electric vehicle.

A respective controllable contactor Sc1, Sc2 is used to electrically connect the traction battery BT to a positive and a negative power supply line LP, LN, respectively, of the high voltage onboard power supply system path HZ. In addition to the first contactor Sc1, the traction battery BT is electrically connected to the positive power supply line LP via a third controllable contactor Sc3 and a protective resistor Rs, wherein the third contactor Sc4 and the protective resistor Rs are electrically connected in series with one another and in parallel with the first contactor Sc1 between the traction battery BT and the positive power supply line LP.

In the high voltage onboard power supply system path HZ, the onboard power supply system BN further has a converter UR that converts the current provided by the traction battery BT into the phase currents and supplies these phase currents to the electric machine EM.

In this case, the positive power supply line LP and the negative power supply line LN connect the traction battery BT to the converter UR, and the current flows through them from the traction battery BT to the converter UR.

Between the positive power supply line LP and the negative power supply line LN, the high voltage onboard power supply system path HZ has an intermediate circuit capacitor Czk that compensates for voltage fluctuations in the operating voltage Ub of the high voltage onboard power supply system path HZ and maintains the operating voltage Ub at the required voltage value.

The positive power supply line LP and the negative power supply line LN further have a voltage measuring unit ME5 provided between them that regularly measures the operating voltage Ub to monitor the voltage fluctuations in the high voltage onboard power supply system path HZ.

The high voltage onboard power supply system path HZ has a respective discharge capacitance Cd between the positive power supply line LP and electrical ground MA and between the negative power supply line LN and the electrical ground MA.

The onboard power supply system BN further comprises a low voltage onboard power supply system path, which is not shown in the figure, in which, depending on the design of the electric vehicle, an operating voltage of 12 volts, for example, prevails. This low voltage onboard power supply system path has loads electrically connected in it that operate at the operating voltage 12 volts. These loads are vehicle lighting, navigation appliance, electrical window heating or electrical air conditioning compressor, for example.

The operating voltage Ub in the high voltage onboard power supply system path Hz is, at 500 volts, life threatening to vehicle occupants. So that the current in the high voltage onboard power supply system path HZ at the high operating voltage Ub does not discharge in an uncontrolled manner via the low voltage onboard power supply system path or via electrical ground MA on the onboard power supply system BN or vehicle bodywork and endanger the health of the vehicle occupants, the high voltage onboard power supply system path HZ and the two power supply lines LP, LN are DC isolated and electrically insulated from the remainder of the onboard power supply system BN and hence from the low voltage onboard power supply system path or the electrical ground MA.

The electrical insulation between the high voltage onboard power supply system path HZ and the remainder of the onboard power supply system BN and hence the electrical ground MA is shown schematically in the figure with a fictitious insulation resistance R_ISO.

So that no current can flow from the high voltage onboard power supply system path HZ to the low voltage onboard power supply system path or to the electrical ground MA and electrocute human beings, the insulation resistance R_ISO must be sufficiently high. If failures or faults occur in the onboard power supply system BN, it can happen that the DC isolation between the high voltage onboard power supply system path HZ and the remainder of the onboard power supply system BN or the electrical ground MA is interrupted, which can cause damage to the electric vehicle and to vehicle occupants.

To increase safety for the electric vehicle, the electrical insulation or an insulation resistance between the high voltage onboard power supply system path HZ and the remainder of the onboard power supply system BN or the electrical ground MA needs to be continuously monitored. If the insulation resistance value is below a predetermined reference resistance value, then the traction battery BT needs to be electrically isolated from the high voltage onboard power supply system path HZ by means of controlled opening of all three contactors Sc1, Sc2, Sc3, and the intermediate circuit capacitor Czk needs to be discharged to a charging voltage of below 60 volts.

To this end, the onboard power supply system BN comprises an apparatus V for monitoring the electrical insulation in the onboard power supply system BN or between the high voltage onboard power supply system path HZ and the remainder of the onboard power supply system BN or the electrical ground MA.

The apparatus V has an electrical connection point SP via which the positive and negative power supply lines LP, LN of the high voltage onboard power supply system path HZ are electrically connected or connectable to one another. Between the electrical connection point SP and the positive power supply line LP, the apparatus V has a first current path Pa in which a first controllable switch S1, a first coupling resistor RA and a first current measuring unit ME1 are wired in series.

Analogously, the apparatus V has, between the electrical connection point SP and the negative power supply line LN, a second current path Pb in which a second controllable switch S2, a second coupling resistor Rb and a second current measuring unit ME2 are wired in series.

Between the electrical connection point SP and the electrical ground MA, the apparatus V has a power source SQ that is in the form of a DC-DC voltage converter having an inverter that can be switched on/off. A positive electrical connection AP electrically connects the power source SQ to the electrical connection point SP. A negative electrical connection AN electrically connects the power source SQ to the electrical ground MA.

Between the electrical connection point SP and the positive electrical connection AP of the power source SQ, a third current path Pc has therefore formed in which a third current measuring unit ME3 of the apparatus V is electrically connected. Between the positive electrical connection AP of the power source SQ and the electrical ground MA, the apparatus V has a voltage divider ST that is wired in parallel with the power source SQ. The voltage divider ST comprises two resistors R1, R2 wired in series. Between an electrical connecting point VP for these two resistors R1, R2 and the electrical ground MA, the apparatus V has a voltage measuring unit ME4.

The apparatus V further comprises a control unit SE for closing and opening the two switches S1, S2. The apparatus V moreover comprises an ascertainment unit EE for ascertaining the fictitious insulation resistance R_ISO. The ascertainment unit EE comprises a first, a second, a third, a fourth and a fifth signal input SE1, SE2, SE3, SE4 and SE5. The first signal input SE1 electrically connects the ascertainment unit EE to a signal output SA1 of the first current measuring unit ME1, the second signal input SE2 electrically connects said ascertainment unit to a signal output SA2 of the second current measuring unit ME2, the third signal input SE3 electrically connects said ascertainment unit to a signal output SA3 of the third current measuring unit ME3, and the fourth signal input SE4 electrically connects said ascertainment unit to a signal output SA4 of the voltage measuring unit ME4. The fifth signal input SE5 electrically connects the ascertainment unit EE to a signal output SA5 of the voltage measuring unit ME5.

Figure 2:
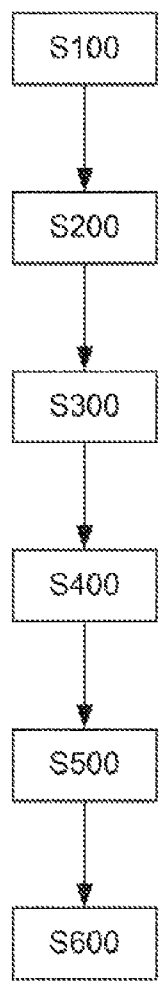
FIG. 2 shows a schematic diagram of a method according to an embodiment of the invention.

The operation of the apparatus V, particularly the ascertainment unit EE, is described in more detail below with reference to FIG. 2 in conjunction with the description of the method for monitoring the electrical insulation for the onboard power supply system BN or for the high voltage onboard power supply system path HZ of the onboard power supply system BN.

To monitor the electrical insulation for the onboard power supply system BN, the fictitious insulation resistance R_ISO is continuously ascertained during operation of the electric vehicle. To this end, the control unit SE closes the two switches S1, S2, in accordance with a method step S100, and therefore connects the apparatus V along with the power source SQ to the high voltage onboard power supply system path HZ and makes electrical connections in the first and second current paths Pa, Pb. This forms a circuit from the positive power supply line LP via the first and second current paths Pa, Pb to the negative power supply line LN, through which circuit a system current In flows from the positive power supply line LP to the negative power supply line LN.

The power source SQ generates a first DC voltage having a first prescribed voltage value Uq1 of 60 volts for a prescribed first period in accordance with a method step S200. In this case, the power source SQ converts the 12 volt operating voltage from the low voltage onboard power supply system path to 60 volts.

This first DC voltage produces direct currents Ic, Ia, Ib that flow from the third current path Pc to the first and second current paths Pa, Pb. These direct currents Ia, Ib that flow through the first and second current paths Pa, Pb therefore overlap the system current In flowing through the first and second current paths Pa, Pb and result in current alterations for the system current In. These current alterations are measured by the first and second current measuring units ME1, ME2 in accordance with a further method step S300 and are forwarded to the ascertainment unit EE via the respective signal outputs SA1, SA2 as respective first measured current values Ia1, Ib1. The third current measuring unit ME3 likewise measures the direct current Ic that flows through the third current path Pc under the effect of the first DC voltage, and forwards a first measured current value Ic1 of the direct current to the ascertainment unit EE via the signal output SA3.

In this case, the three current measuring units ME1, ME2, ME3 measure the relevant currents Ia, Ib and Ic in a manner offset in time by a prescribed interval of time from the starting time at which the power source SQ starts to generate the first DC voltage. This prescribed interval of time corresponds to the period that the intermediate circuit capacitor Czk and the discharge capacitances Cd require for damping after the first DC voltage is applied to the high voltage onboard power supply system path HZ.

Simultaneously, the voltage measuring unit ME4 measures the voltage U2 dropped across the resistor R2 of the voltage divider ST and sends a first measured voltage value U21 to the ascertainment unit EE via the signal output SA4.

During the driving mode of the electric vehicle, the traction battery BT supplies current to the converter UR or the electric machine EM via the two power supply lines LP, LN. On account of the load fluctuations in the high voltage onboard power supply system path HZ, the operating voltage Ub fluctuates. The voltage fluctuations in the operating voltage Ub influence the result of ascertainment of the insulation resistance R_ISO. In order to be able to ascertain the insulation resistance R_ISO reliably, the voltage fluctuations in the operating voltage Ub are taken into consideration for the ascertainment.

To this end, the ascertainment unit EE receives a first operating voltage value Ub1 from the voltage measuring unit ME5 that is in the high voltage onboard power supply system path HZ via the fifth signal input SE5, said operating voltage value having been measured by the voltage measuring unit ME5 at the same time as the measurement of the first measured current values Ia1, Ib1, Ic1.

After the first period and a further prescribed interval of time that is required for the damping of the intermediate circuit capacitor Czk and of the discharge capacitances Cd have elapsed, the power source SQ generates a second DC voltage having a second prescribed voltage value Uq2 of −60 volts for a prescribed second period in accordance with a further method step S400. In this case, the power source SQ converts the 12 volt operating voltage from the low voltage onboard power supply system path to 60 volts and inverts the latter.

In accordance with a further method step S500 and analogously to method step S300, the three current measuring units ME1, ME2, ME3 measure, during the second period and in a manner offset in time by a prescribed interval of time from the starting time at which the power source SQ starts to generate the second DC voltage, the relevant currents Ia, Ib and Ic that flow through the respective current paths Pa, Pb and Pc under the effect of the second DC voltage and hence correspond to the respective current alterations that are brought about by the second DC voltage. Subsequently, the three current measuring units ME1, ME2, ME3 forward respective second measured current values Ia2, Ib2, Ic2 to the ascertainment unit EE.

Simultaneously, the voltage measuring unit ME4 measures the voltage U2 dropped across the resistor R2 of the voltage divider ST and sends a second measured voltage value U22 to the ascertainment unit EE. Likewise simultaneously, the voltage measuring unit ME5 measures the operating voltage Ub in the high voltage onboard power supply system path HZ and forwards a second operating voltage value Ub2 to the ascertainment unit EE as a measured value.

In accordance with a further method step S600, the ascertainment unit EE compares the two operating voltage values Ub1, Ub2 with one another. If the two operating voltage values Ub1, Ub2 differ from one another and if the discrepancy between the two operating voltage values Ub1, Ub2 exceeds a prescribed limit value, then the first measured current values Ia1, Ib1 are rejected and method steps S200 and S300 are repeated. To this end, the first DC voltage having the voltage value Uq1 of 60 volts is generated again and the currents Ia, Ib, Ic and also the voltages U2, Ub are measured again.

The third operating voltage value Ub3 obtained in this manner is then compared with the most recently measured second operating voltage value Ub2. If the discrepancy between the second and third operating voltage values Ub2, Ub3 continues to exceed the limit value, then the second measured current values Ia2, Ib2 are also rejected and method steps S400 and S500 are repeated. To this end, the second DC voltage having the voltage value Uq2 of −60 volts is generated again and the currents Ia, Ib, Ic and also the voltages U2, Ub are measured again.

Method steps S200 and S300 or S400 and S500 are repeated until the discrepancy between two successively measured operating voltage values is less than the limit value. If the two operating voltage values Ub1, Ub2 are the same or the discrepancy between the two operating voltage values Ub1, Ub2 is less than the limit value, then the ascertainment unit EE takes the first and second measured voltage values U21, U22 and, on the basis of the following two equations, computes the first voltage value Uq1 of the first DC voltage and the second voltage value Uq2 of the second DC voltage that the power source SQ has actually generated:

$$Uq1 = \frac{R1 + R2}{R2} \cdot U21$$

$$Uq2 = \frac{R1 + R2}{R2} \cdot U22$$

The measurement of the two measured voltage values U21, U22 and the subsequent computation of the two voltage values Uq1, Uq2 of the actually generated DC voltages avoid a possible ascertainment error for the insulation resistance as a result of discrepancy in the power source SQ and hence increase the accuracy for the ascertained insulation resistance R_ISO. After the ascertainment unit EE has computed the two voltage values Uq1, Uq2 of the actually generated DC voltages, it takes these two voltage values Uq1, Uq2 and the respective first and second measured current values Ia1, Ia2, Ib1, Ib2 from the first and second current measuring units ME1, ME2 as a basis for ascertaining the insulation resistance R_ISO on the basis of the following equation:

$$R\_ISO = \frac{(Uq1 - Ia1 \cdot Ra) + (Uq1 - Ib1 \cdot Rb) - (Uq2 - Ia2 \cdot Ra) - (Uq2 - Ib2 \cdot Ra)}{2 \cdot ((Ia1 - Ia2) + (Ib1 - Ib2))}$$

In this case, Ra and Rb are the respective resistance value of the respective coupling resistances Ra, Rb and R_ISO is the resistance value of the insulation resistance R_ISO. Subsequently, the ascertainment unit EE optionally checks the accuracy of the ascertained insulation resistance R_ISO on the basis of the measured current values Ic1, Ic2 from the third current measuring unit ME3, which have not been used to ascertain the insulation resistance R_ISO.

Alternatively, the ascertainment unit EE can ascertain the insulation resistance R_ISO by using the measured current values Ic1, Ic2 from the third current measuring unit ME3 instead of the measured current values Ia1, Ia2 from the first current measuring unit ME1 or the measured current values Ib1, Ib2 from the second current measuring unit ME2. In this case, however, slight adjustments to the equation above are required by means of a conversion between the measured current values Ia1, Ia2, Ib1, Ib2, Ic1 and Ic2 on the basis of the following equations:

$$Ic1 = Ia1 + Ib1$$

$$Ic2 = Ia2 + Ib2$$

The measured current values Ia1, Ia2, Ib1, Ib2 from the first or from the second current measuring unit ME1, ME2 that have not been used for ascertaining the insulation resistance R_ISO can then be used to check the ascertained insulation resistance R_ISO. The ascertained insulation resistance R_ISO is subsequently compared with a prescribed reference resistance R_REF. If the ascertained insulation resistance R_ISO exceeds the reference resistance R_REF, then it is assumed that the electrical insulation in the onboard power supply system BN or between the high voltage onboard power supply system path HZ and the remainder of the onboard power supply system BN or the electrical ground MA is sufficiently high and meets appropriate safety requirements.

As soon as the ascertained insulation resistance R_ISO is below the reference resistance R_REF, it is assumed that there is an electrical leak between the high voltage onboard power supply system path HZ and the remainder of the onboard power supply system BN or the electrical ground MA. Accordingly, the traction battery BT is electrically isolated from the high voltage onboard power supply system path HZ by means of controlled opening of the three contactors Sc1, Sc2, Sc3, and the intermediate circuit capacitor Czk is discharged to a charging voltage below 60 volts and further suitable measures are initiated.

In respective method step S300 or S500, it is also possible for multiple measured current and voltage values for the respective currents Ia, Ib, Ic and the voltage U2 to be measured in succession and for mean values for the respective measured current values Ia1, Ia2, Ib1, Ib2, Ic1, Ic2 and the respective measured voltage values U21, U22 to be formed from the multiple measured values. This filters out possible perturbations such as current fluctuations in the onboard power supply system BN and hence increases the accuracy for the ascertained insulation resistance R_ISO.

In an alternative embodiment, the measured current values Ia1, Ib2 measured previously are not rejected when the limit value is exceeded as a result of the discrepancy between the first and second operating voltage values Ub1, Ub2.

In this embodiment, the insulation resistance R_ISO is ascertained from the first and second measured current values Ia1, Ib1, Ia2 and Ib2 and also the first and second measured voltage values U21, U22 on the basis of the equations above and is corrected by a correction factor. To this end, an appropriate correction factor is read from a correction factor table, ascertained in advance, on the basis of the discrepancy. The computed insulation resistance is then corrected by this correction factor. The corrected insulation resistance value obtained in this manner is then compared as the present insulation resistance R_ISO of the high voltage onboard power supply system path HZ with the reference resistance value.

Once the ascertainment is complete, the control unit SE opens the two switches S1, S2 and hence isolates the apparatus V from the onboard power supply system BN or the high voltage onboard power supply system path HZ.

What is claimed is:

1. An apparatus for monitoring an electrical insulation for an onboard power supply system of a vehicle, the apparatus comprising:
   a power source configured to generate a first DC voltage having a first voltage value and a second DC voltage having a second voltage value;
   an electrical connection point via which a positive power supply line of the onboard power supply system and a negative power supply line of the onboard power supply system are electrically connected to one another;
   a first current path between the positive power supply line and the electrical connection point;
   a second current path between the negative power supply line and the electrical connection point;
   a third current path between the electrical connection point and the power source;
   at least two of the following three current measuring units:
   a first current measuring unit in the first current path for measuring a first current flowing through the first current path;
   a second current measuring unit in the second current path for measuring a second current flowing through the second current path;
   a third current measuring unit in the third current path for measuring a third current flowing through the third current path;
   an ascertainment unit that is electrically connected to the respective signal output of the at least two of the three current measuring units via signal inputs;
   wherein the ascertainment unit is configured to ascertain from measured current values from the at least two of the three current measuring units and also the first and the second voltage value an insulation resistance between the onboard power supply system and electrical ground;
   wherein the first voltage value is about 50 to about 60 volts and the second voltage value is about −60 to about −50 volts.

2. The apparatus as claimed in claim 1, wherein the apparatus comprises all three current measuring units and wherein the ascertainment unit is electrically connected to the respective signal output of the three current measuring units via the signal inputs.

3. The apparatus as claimed in claim 1, wherein the apparatus has, in the first current path, a first resistor for limiting the first and the third current, and has, in the second current path, a second resistor for limiting the second and the third current.

4. The apparatus of claim 1, wherein the apparatus has, in the first current path, a first controllable switch configured to break or make electrical connection in the first current path and has, in the second current path, a second controllable switch configured to break or make electrical connection in the second current path.

5. A method for monitoring an electrical insulation for an onboard power supply system of a vehicle, the method comprising:
   wiring a power source between electrical ground and an electrical connection point via which a positive power supply line of the onboard power supply system and a negative power supply line of the onboard power supply system are electrically connected to one another;

generating a first DC voltage having a first voltage value, by the power source;

measuring a first current value of a first and a second current, wherein the first and the second current each flow through one of the following three current paths under the effect of the first DC voltage:

a first current path between the positive power supply line and the electrical connection point;

a second current path between the negative power supply line and the electrical connection point;

a third current path between the electrical connection point and the power source;

generating a second DC voltage having a second voltage value by the power source;

measuring a second current value flowing through the respective current path in each case under the effect of the second DC voltage; and determining an insulation resistance between the onboard power supply system and electrical ground from the first and the second voltage value and also the first and the second measured current values;

wherein, the insulation resistance is computed as the quotient of the difference between the first and the second voltage values corrected by respective voltage values dropped across respective resistors of the respective current paths and the difference between the first and the second current values.

6. The method of claim 5, wherein the insulation resistance is determined from the following equation:

$$R\_ISO = \frac{(Uq1 - Ia1 \cdot Ra) + (Uq1 - Ib1 \cdot Rb) - (Uq2 - Ia2 \cdot Ra) - (Uq2 - Ib2 \cdot Ra)}{n \cdot ((Ia1 - Ia2) + (Ib1 - Ib2))}$$

where n is a numerical coefficient,

Ra and Rb are resistance values in the respective current paths (Pa, Pb) through which the respective currents (Ia, Ib) flow under the effect of the first and second DC voltages.

7. The method of claim 6, wherein measuring a first current value provides a first operating voltage value of the operating voltage of the onboard power supply system to be measured;

measuring a second current provides a second operating voltage value of the operating voltage to be measured;

wherein the first and the second operating voltage values are compared with one another;

wherein in the event of a discrepancy between the first and the second operating voltage values:

the first measured current values are rejected;

a third DC voltage having a third voltage value is generated by the power source; and a respective third measured current value of the first and the second current flowing through the respective current path in each case under the effect of the third DC voltage is measured; and wherein the step of determining an insulation resistance further provides for the insulation resistance to be ascertained from the second and the third voltage values and also the second and the third measured current values.

8. The method of claim 7 wherein:

the step of measuring a first current further provides for a first operating voltage value of the operating voltage to be measured;

the step of measuring a second current further provides for a second operating voltage value of the operating voltage to be measured;

wherein the first and the second operating voltage value are compared with one another, wherein in the event of a discrepancy between the first and the second operating voltage value, a correction factor is ascertained, and the step of determining an insultation resistance further provides for the insulation resistance to be corrected by the correction factor.

9. The method of claim 8, wherein the correction factor is read from a previously ascertained correction factor table on the basis of the discrepancy between the first and the second operating voltage values.

10. The method of claim 5, wherein the step of measuring a first current value further provides for not only the first measured current values of the first and the second current but also a first measured current value of a third current flowing through the remaining current path in the three current paths under the effect of the first DC voltage to be measured;

the step of measuring a second current further provides for not only the second measured current values of the first and the second current but also a second measured current value of the third current flowing through the remaining current path under the effect of the second DC voltage to be measured;

wherein the first and the second measured current value of the third current are used to check the accuracy of the ascertained insulation resistance.

* * * * *